United States Patent
Satomi et al.

(10) Patent No.: US 7,602,120 B2
(45) Date of Patent: Oct. 13, 2009

(54) ELECTROLUMINESCENCE PANEL AND METHOD OF MAKING THE SAME

(75) Inventors: Noriaki Satomi, Tokyo (JP); Yukihiro Azuma, Tokyo (JP)

(73) Assignee: TDK Corporation, Tokyo (JP)

( * ) Notice: Subject to any disclaimer, the term of this patent is extended or adjusted under 35 U.S.C. 154(b) by 326 days.

(21) Appl. No.: 11/644,965

(22) Filed: Dec. 26, 2006

(65) Prior Publication Data

US 2007/0159097 A1 Jul. 12, 2007

(30) Foreign Application Priority Data

Dec. 28, 2005 (JP) ............................. 2005-380057

(51) Int. Cl.
*H01J 1/62* (2006.01)
*H01J 9/00* (2006.01)

(52) U.S. Cl. ........................ 313/506; 313/512; 445/23

(58) Field of Classification Search ......... 313/501–512; 445/23–25
See application file for complete search history.

(56) References Cited

U.S. PATENT DOCUMENTS

| 6,617,052 B2 | 9/2003 | Morii |
| 6,896,572 B2 | 5/2005 | Park et al. |
| 2001/0044035 A1 | 11/2001 | Morii |
| 2002/0125817 A1 | 9/2002 | Yamazaki et al. |
| 2003/0218422 A1* | 11/2003 | Park et al. .................... 313/512 |
| 2005/0260337 A1* | 11/2005 | Ogura et al. ................... 427/66 |

FOREIGN PATENT DOCUMENTS

| CN | 1317922 A | 10/2001 |
| JP | A-2001-093661 | 4/2001 |
| JP | A-2001-203076 | 7/2001 |
| JP | A 2003-197366 | 7/2003 |
| JP | A-2005-209631 | 8/2005 |
| JP | A-2005-294057 | 10/2005 |
| KR | 2003-0090419 A | 11/2003 |

* cited by examiner

*Primary Examiner*—Joseph L Williams
(74) *Attorney, Agent, or Firm*—Oliff & Berridge, PLC

(57) ABSTRACT

An EL panel which can restrain a sealing resin from deteriorating characteristics of EL devices even when sealed with the resin, and a method of making the same are provided. An EL panel 1 in accordance with the present invention comprises a plurality of EL devices 20 constructed by successively laminating an anode 12, an organic layer 16, and a cathode 18 on a transparent substrate 10; walls 14 positioned between the EL devices 20 adjacent to each other; and a sealing plate 22 integrally covering the plurality of EL devices 20 and walls 14; wherein a resin 24 is interposed between the transparent substrate 10 and the sealing plate 22, while a space 26 is formed between the wall 14 and the organic layer 16 of the EL devices 20, whereby resin components of the sealing resin 24 are significantly restrained from eroding the organic layer 16 of the EL devices 20.

4 Claims, 5 Drawing Sheets

(a)

(b)

ELECTROLUMINESCENCE PANEL AND METHOD OF MAKING THE SAME

BACKGROUND OF THE INVENTION

1. Field of the Invention

The present invention relates to an EL panel and a method of making the same.

2. Related Background Art

EL (Electro Luminescence) devices such as organic and inorganic EL devices are light-emitting devices of self-emission type characterized in that they are easy to reduce their size and weight while exhibiting a high luminance, and thus are expected to be employed in displays, illuminations, and the like. However, luminous materials used in these EL devices tend to be easily deteriorated by air (its water content such as moisture in particular), which is one of factors preventing the devices from achieving a longer life. Therefore, the EL devices have conventionally been in use in the form of EL panels sealing the devices therein in order to make them less likely to come into contact with air.

Known as a mode of such sealing is that of hollow type in which an EL device is arranged between a substrate and a sealing plate, while only the outer peripheral part is filled with a sealant made of a resin or the like. However, the hollow-type sealing often makes it necessary to introduce a desiccant or the like into the hollow part in order to completely eliminate the moisture therefrom, which makes it harder to reduce the size and thickness of the EL panel.

Therefore, for reducing such inconveniences, a solid seal type structure in which a region including the EL device between the substrate and the sealing plate is totally filled with a curable resin so as to form an adhesive layer without making it hollow has been known (see Japanese Patent Application Laid-Open No. 2003-197366). This completely seals the surroundings of the EL device, thereby making it harder for moisture and the like to enter and remain, which makes it unnecessary to introduce the desiccant.

SUMMARY OF THE INVENTION

Making an EL panel by bringing a resin and an EL device into contact with each other may damage the EL device. When the EL device is thus damaged, the original emission of the EL device may not be obtained sufficiently, whereby the EL device may lower its luminance and decrease its emission area.

For solving the problem mentioned above, it is an object of the present invention to provide an EL panel which can restrain a sealing resin from deteriorating characteristics of EL devices even when sealed with a resin, and a method of making the same.

The present invention provides an EL panel comprising a plurality of EL devices constructed by successively laminating a first electrode, an organic layer, and a second electrode on a substrate; a wall positioned between the EL devices adjacent to each other; and a sealing plate integrally covering the plurality of EL devices and the wall; wherein a resin is interposed between the EL devices and the sealing plate on the substrate, while a space is formed between the wall and the organic layer of the EL devices.

Since a space is formed between the wall and the organic layer of the EL devices in this EL panel, the gap between the substrate and the sealing plate is sealed with the resin while the sealing resin is not in contact with the end face of the organic layer on the wall side. This significantly restrains resin components in the sealing resin from eroding the organic layer of the EL devices. Therefore, the sealing resin is kept from deteriorating characteristics of the EL devices in the EL panel in accordance with the present invention.

Preferably, the wall and the resin are in contact with each other. In this case, the void between the adjacent walls is clogged with the resin, which suppresses the flow of air traveling by way of the walls, whereby the EL devices are kept from being influenced by the air.

Preferably, the space is a vacuum or filled with an inert gas. In this case, no air exists in the space, whereby the EL devices are more effectively kept from deteriorating their characteristics.

The present invention provides a method of making an EL panel, the method comprising the steps of forming a wall on a substrate formed with a first electrode; successively laminating an organic layer and a second electrode on the substrate so as to form a plurality of EL devices including the first electrode, organic layer, and second electrode; and bonding a sealing plate coated with a resin and the substrate to each other such that the resin side of the sealing plate and the EL device side of the substrate oppose each other so as to form a space between the wall and the organic layer of the EL devices.

In this method of making an EL panel, a space is formed between the wall and the organic layer of the EL devices when bonding the sealing plate and the substrate to each other. That is, the gap between the substrate and the sealing plate is sealed with the resin while the sealing resin is not in contact with the end face of the organic layer on the wall side. This significantly restrains resin components of the sealing resin from eroding the organic layer of the EL devices. Therefore, the method of making an EL panel in accordance with the present invention yields an EL panel in which the sealing resin is kept from deteriorating characteristics of the EL devices.

A sealing plate coated with a resin in an uncured state may cover a plurality of EL devices and the wall. In this case, the upper part of the wall is buried in the resin, which can fully prevent water from entering from the external environment.

DESCRIPTION OF THE PREFERRED EMBODIMENTS

In the following, modes which seem to be the best when carrying out the present invention will be explained in detail with reference to the accompanying drawings. The same or equivalent constituents will be referred to with the same numerals without repeating their overlapping explanations if any.

Figure 1:
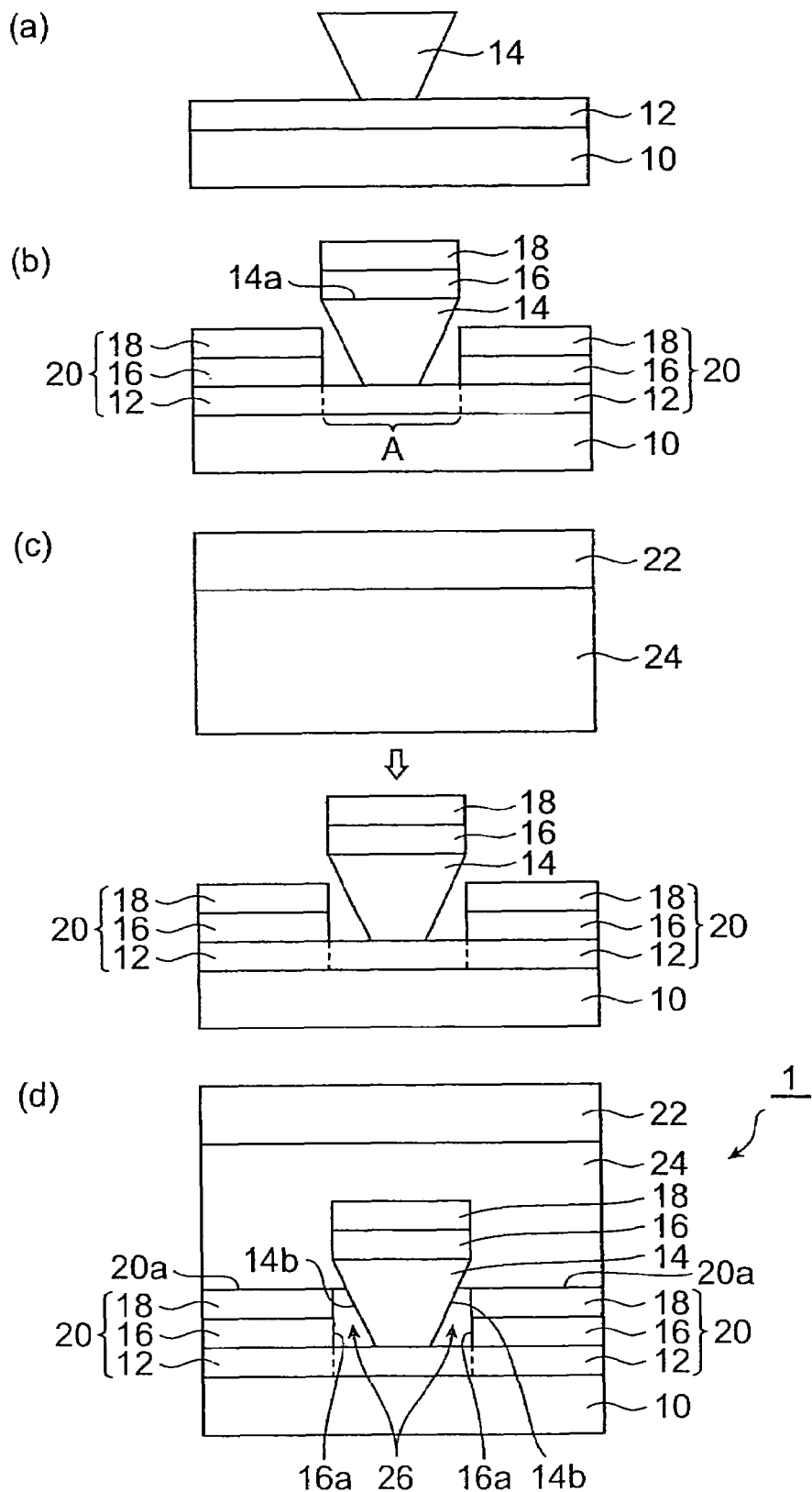
FIG. 1 is a process flow diagram showing a procedure of a method of making an EL panel in accordance with an embodiment of the present invention.

FIG. 1 is a process flow diagram showing a procedure of a method of making an EL panel in accordance with an embodiment of the present invention.

When making an EL panel 1 by using the method of making an EL panel in accordance with this embodiment, as shown in part (a) of FIG. 1, a plurality of anodes (first electrodes) 12 are initially formed on a transparent substrate 10, and then a plurality of walls 14 are formed. Employable as the transparent substrate 10 are glass substrates, plastic substrates, and other substrates made of light-transmitting materials.

A plurality of anodes 12 each of which is a band-shaped transparent electrode (e.g., ITO transparent electrode) are formed in parallel by patterning on the transparent substrate 10. The walls 14 are polymer members extending in the aligning direction of the anodes 12 (i.e., a direction orthogonal to the extending direction of the anodes 12) and having an inversely tapered form. Employable as a material for the walls 14 are positive photosensitive resists such as novolac resins, for example. The walls 14 can be formed such as to have an inversely tapered cross section by using a positive photosensitive resist, for example. The inversely tapered cross section in the specification is not limited to the inverted trapezoidal cross section shown in FIG. 1, but may be a triangular or hexagonal cross section or the like as long as it is a cross-sectional form tapering down in the thickness direction toward the transparent substrate. The wall 14 may also be constructed by laminating a plurality of resins having different forms into a mushroom shape.

Next, as shown in part (b) of FIG. 1, an organic layer 16 and a cathode (second electrode) 18 are successively laminated by vapor deposition on the whole surface of the region formed with the anodes 12 and walls 14 in the surface of the transparent substrate 10. Since the organic layer 16 and cathode 18 are laminated on the upper face 14a of the wall 14 here, the cathode in the wall-forming region A and the cathodes in regions other than the wall-forming region A are separated from each other, so as to be in a nonconductive state. That is, the organic layer 16 and cathode 18 are patterned while using the walls 14 as a mask. Thus, the above-mentioned anodes 12 and the organic layer 16 and cathode 18 laminated on the anodes 12 form a plurality of EL devices 20. In other words, the walls 14 function as a mask, thereby forming cathodes 18 separated into the individual EL devices 20. The plurality of EL devices 20 are arranged into a matrix on the transparent substrate 10, while the walls 14 are positioned between the EL devices 20 adjacent to each other.

Since the walls 14 have an inversely tapered cross section, the side faces of the organic layers 16 and cathodes 18 in the EL devices 20 are separated from the side faces of the walls 14, and voids are formed therebetween.

After forming the EL devices 20 on the transparent substrate 10, a sealing plate 22 coated with an epoxy resin 24 in an uncured state is prepared and is bonded in a vacuum atmosphere to the transparent substrate 10 such that the resin side of the sealing plate 22 and the EL device side of the transparent substrate 10 oppose each other as shown in part (c) of FIG. 1. As a consequence, the plurality of EL devices 20 and plurality of walls 14 on the transparent substrate 10 are integrally covered with the resin 24 of the sealing plate 22. The "uncured state" in this specification refers to a state where the resin is not completely cured. In the case of epoxy resins, for example, it refers to a state free of a peak, derived from an epoxy ring, appearing near 915 cm$^{-1}$. Here, the state where the peak intensity decreases to 10% or less of that in the resin immediately after coating is considered to be completely cured. Employable as the form of the sealing plate 22 are flat forms, forms (cap forms) in which end parts of a flat plate are bent inward, and the like.

Then, as shown in part (d) of FIG. 1, the sealing plate 22 is pressed against the transparent substrate 10 until the resin 24 of the sealing plate 22 comes into contact with surfaces 20a of the EL devices 20, whereby the making of the resin-sealed EL panel 1 is completed. Here, a space 26 defined by the anode 12, the wall 14, the resin 24, and the organic layer 16 and cathode 18 of the EL device 20 is formed between a side face 16a of the organic layer 16 of the EL device 20 and a side face 14b of the wall 14. The end face 16a of the organic layer 16 on the wall 14 side is exposed to the space 26. Since the resin sealing step of the EL panel 1 is performed in the vacuum atmosphere as mentioned above, the space 26 is a vacuum.

In the EL panel 1, as explained in the foregoing, the end face 16a of the organic layer 16 on the wall 14 side is exposed to the space 26, and the gap between the transparent substrate 10 and the sealing plate 22 is sealed with the resin 24 while the sealing resin 24 is not in contact with the end face 16a.

If a resin component such as a curing agent in the sealing resin 24 erodes the organic layer 16, shrinkage, dark spots, and the like may occur, thereby shortening the device life of EL devices. However, the above-mentioned EL panel 1 significantly restrains resin components of the sealing resin 24 from eroding the organic layers 16 of the EL devices 20, and thus keeps the sealing resin 24 from deteriorating characteristics such as device life of the EL devices 20. In particular, since the space 26 is a vacuum in the EL panel 1, air including oxygen and water does not substantially exist in the space 26 and thus is also restrained from affecting the EL devices 20. When the space 26 is filled with an inert gas such as $N_2$ gas or Ar gas, air including oxygen and water does not substantially exist in the space 26, whereby the deterioration in characteristics of the EL devices 20 is also suppressed in this case.

Since the resin 24 applied to the sealing plate 22 is in the uncured state, the upper parts of the walls 14 are buried in the resin 24 in the EL panel 1. This can prevent water from entering from air more effectively than in the case where the walls 14 are not buried in the resin 24.

Since the walls 14 and resin 24 are in contact with each other, voids between the adjacent walls 14 are clogged with the resin 24. This suppresses the flow of air traveling by way of the walls 14, whereby air is kept from flowing into the voids between the adjacent walls 14. This restrains water contained in air from affecting the EL devices 20. That is, water contained in air can enter the gaps between the adjacent walls 14 only through the resin. Since the movement of air in the resin is much slower than the movement of water in the air, the water is harder to affect the EL devices 20. As a result, the EL devices 20 and EL panel 1 attain a longer life.

Figure 2:
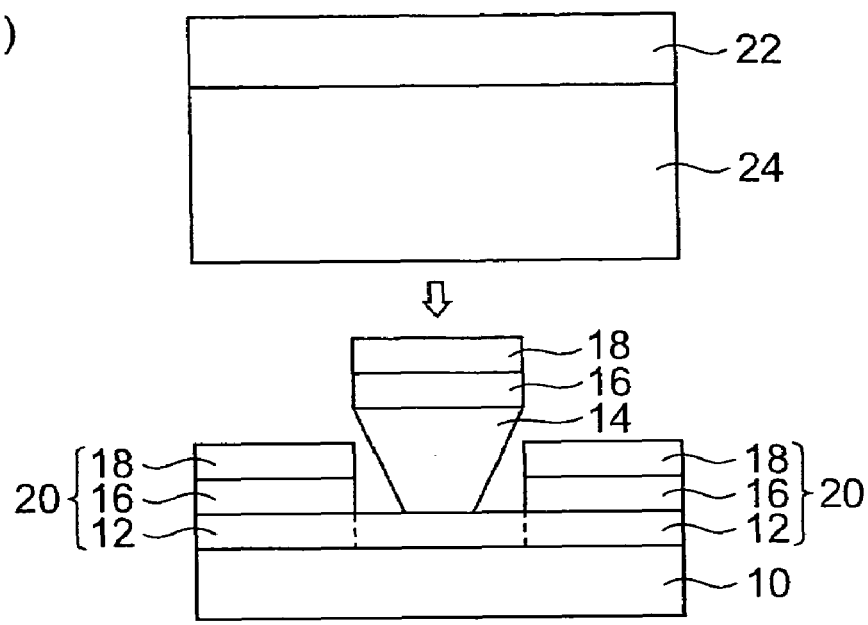
FIG. 2 is a process flow diagram showing a procedure of a method of making an EL panel partly different from that of FIG. 1.
Figure 2:
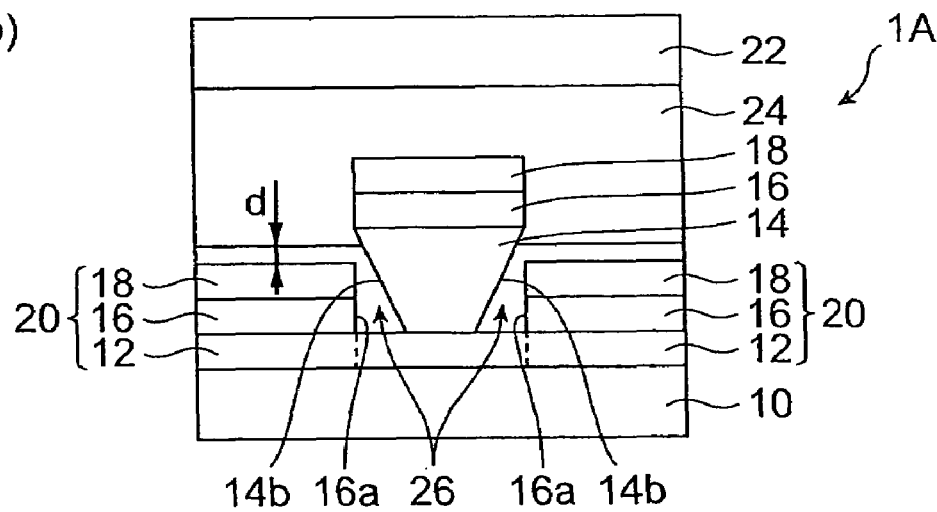

An EL panel 1A made by a manufacturing method shown in FIG. 2 different from the above-mentioned embodiment can also yield effects similar to those of the EL panel 1. FIG. 2 is a process flow diagram showing the procedure of the method of making the EL panel 1A.

The manufacturing process of the EL panel 1A is the same as that of the EL panel 1 until the step of making the EL devices 20 (i.e., the step shown in part (b) of FIG. 1). After making the EL devices 20, the transparent substrate 10 is covered with a sealing plate 22 coated with an epoxy resin 24 in an uncured state as shown in part (a) of FIG. 2. Then, as shown in part (b) of FIG. 2, the sealing plate 22 is pressed against the transparent substrate 10 until the resin 24 of the sealing plate 22 and the surfaces 20a of the EL devices 20 attain a predetermined distance d therebetween, whereby the making of the resin-sealed EL panel 1A is completed. The space 26 exposing the end face 16a of the organic layer 16 on the wall 14 side is formed between the side face 16a of the organic layer 16 of the EL device 20 and the side face 14b of the wall 14 in the EL panel 1A as in the EL panel 1. Therefore, the EL panel 1A also keeps the sealing resin 24 from deteriorating characteristics of the EL devices 20 such as their device life.

Figure 3:
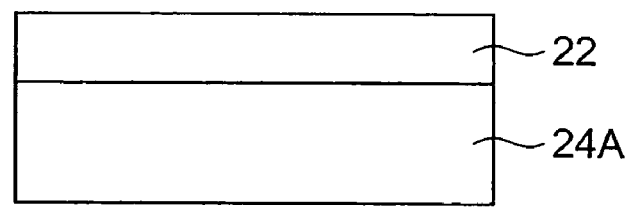
FIG. 3 is a process flow diagram showing a procedure of a method of making an EL panel partly different from that of FIG. 1.
Figure 3:
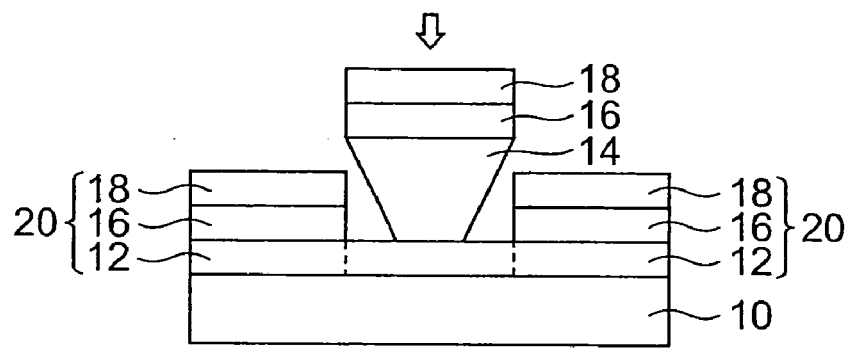
Figure 3:
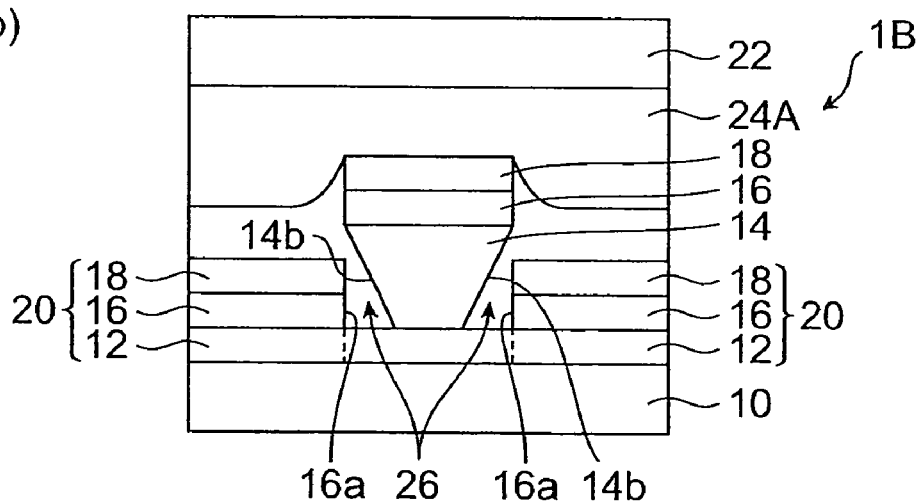

An EL panel 1B made by using a manufacturing method shown in FIG. 3 different from the above-mentioned embodiment can also yield effects similar to those of the EL panels 1 and 1A. FIG. 3 is a process flow diagram showing the procedure of the method of making the EL panel 1B.

The manufacturing process of the EL panel 1B is the same as that of the EL panel 1 until the step of making the EL devices 20 (i.e., the step shown in part (b) of FIG. 1). After making the EL devices 20, the transparent substrate 10 is covered with a sealing plate 22 coated with an epoxy resin 24A in a cured state as shown in part (a) of FIG. 3. Then, as shown in part (b) of FIG. 3, the sealing plate 22 is pressed against the transparent substrate 10 by a predetermined pressure, and the sealing plate 22 and the transparent substrate 10 are coupled to each other by a coupling member which is not depicted, whereby the making of the resin-sealed EL panel 1B is completed. The space 26 exposing the end face 16a of the organic layer 16 on the wall 14 side is formed between the side face 16a of the organic layer 16 of the EL device 20 and the side face 14b of the wall 14 in the EL panel 1B as in the EL panels 1 and 1A. Therefore, the EL panel 1B also keeps the sealing resin 24A from deteriorating characteristics of the EL devices 20 such as their device life.

Without being restricted to the above-mentioned embodiment, the present invention can be modified in various ways. For example, the resin interposed between the substrate and the sealing plate may be provided by ejecting the resin onto the substrate by ink jetting instead of being applied onto the sealing plate. The resin may be not only the epoxy resin but also a silicone resin or the like. The first and second electrodes may also be a cathode and an anode, respectively.

The present invention may also be an EL panel of a type in which its sealing plate transmits light therethrough so that light of its EL device is taken out from the sealing plate side. Since a resin integrally formed with the sealing plate exists on the EL device in this case, light emitted and radiated from the EL device is restrained from scattering, whereby the light can be taken out from the EL panel more efficiently as compared with the case where there is no resin on the EL device.

EXAMPLES

Details of the present invention will now be explained with reference to examples.

Example

Using the manufacturing method shown in the above-mentioned embodiment, the inventors made an EL panel #1 similar to the EL panel 1 by the following procedure.

First, a plurality of anodes made of ITO (tin-doped indium oxide) were formed by patterning on a transparent substrate (glass substrate). Thereafter, a plurality of walls (walls made of a positive photosensitive resist (based on a novolac resin)) were formed in the aligning direction of the anodes 12 (see part (a) of FIG. 1).

Next, an organic layer (formed by laminating 4,4',4"-tris (3-methylphenylphenylamino)phenylamine (MTDATA), N,N,N',N'-tetrakis(3-biphenyl)-4,4'-diamino-1,1'-biphenyl (TPD), and Alq3:tris(8-quinolinato)aluminum in this order) and a cathode (formed by laminating an Ag/Mg alloy and Al in this order) were successively laminated by vapor deposition on the whole surface of the region formed with the anodes and walls in the transparent substrate surface (see part (b) of FIG. 1). Here, the anodes and the organic layer and cathode laminated on the anodes form a plurality of EL devices.

After forming the EL devices, a sealing plate coated with an epoxy resin in an uncured state was prepared, and was bonded to the transparent substrate in a vacuum atmosphere such that the resin side of the sealing plate and the EL device side of the transparent substrate opposed each other (see part (c) of FIG. 1). This epoxy resin was one free of a peak, derived from an epoxy ring, appearing near 915 cm$^{-1}$ when observing the IR spectrum of the resin.

Then, the sealing plate was pressed against the transparent substrate until the resin of the sealing plate came into contact with the surfaces of the EL devices, whereby the resin-sealed EL panel #1 was obtained (see part (d) of FIG. 1). Here, a space was formed between the side face of each EL device on the organic layer side and a side face of its corresponding wall, and the end face of the organic layer on the wall side was exposed to the space.

Comparative Example

As a comparative example, an EL panel #2 made by a manufacturing method which was the same as the manufacturing method of the above-mentioned EL panel #1 except that no space was provided (i.e., the gap between the transparent substrate and the sealing plate was completely filled with the sealing resin) was prepared.

Measurement of Luminance in EL Panels

Luminance was measured in the above-mentioned EL panel #1 (Example) and EL panel #2 (Comparative Example). While applying a driving voltage of 5 V to the organic EL devices produced, the luminance of the light emitted from the sealing plate side in the forward direction was measured by a luminance meter (MCPD-7000 manufactured by Otsuka Electronics Co., Ltd.). The results of luminance measurement were as shown in the graph of FIG. 4.

Evaluation of Luminance in EL Panels

Figure 4:
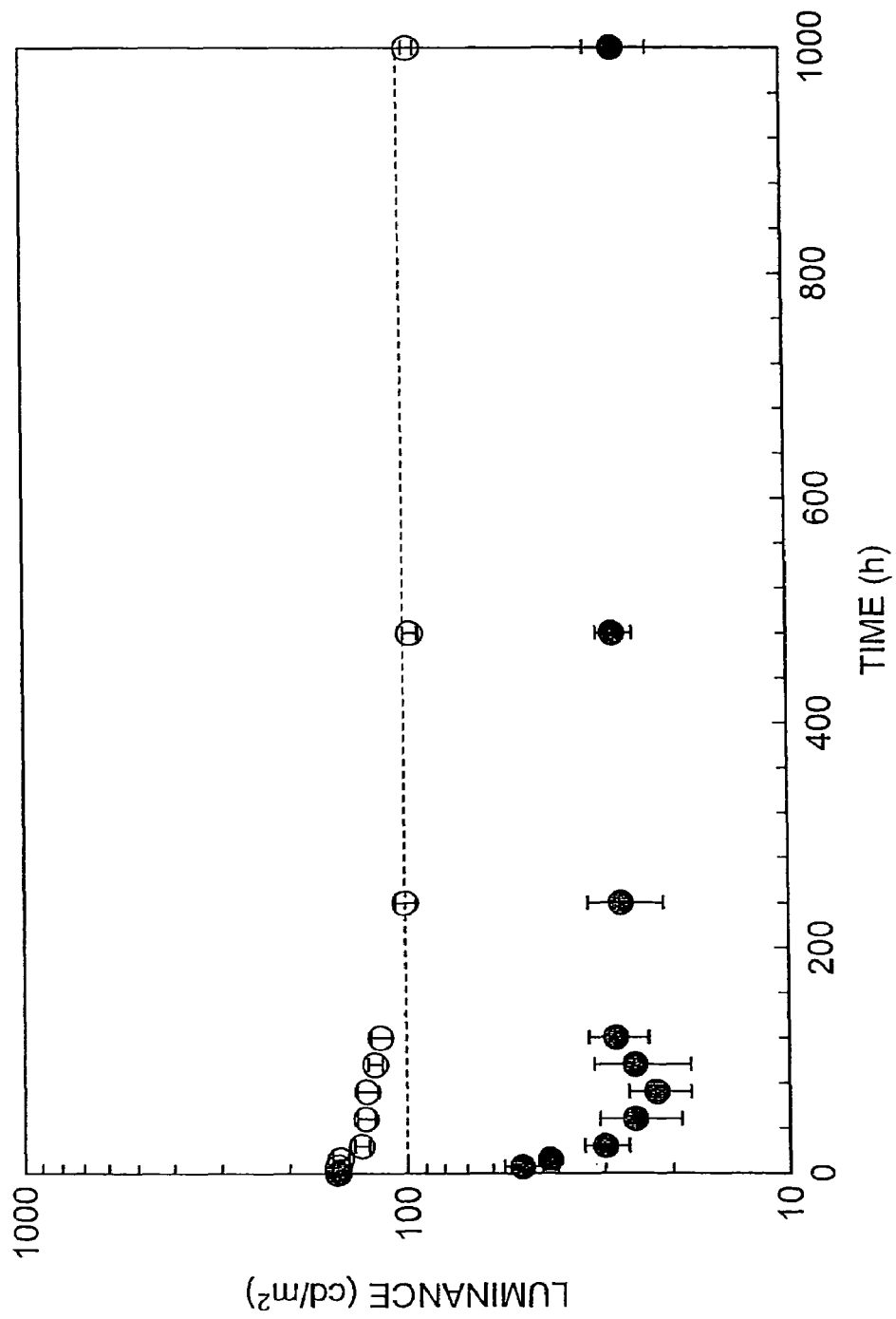
FIG. 4 is a graph showing results of measurement of luminance in examples.

As can be seen from the graph of FIG. 4, the luminance of the EL panel #1 indicated by white circles, maintained high levels even after 1000 hours. On the other hand, the luminance of the EL panel #2 indicated by black circles dropped immediately after starting the measurement and remained at low levels thereafter. Thus, the life of the EL panel #1 was remarkably longer than that of the EL panel #2. That is, the deterioration in EL devices was suppressed in the EL panel #1 as Example, so as to elongate its life, when compared with the EL panel #2 as Comparative Example.

Evaluation of Appearance of EL Panels

Figure 5:
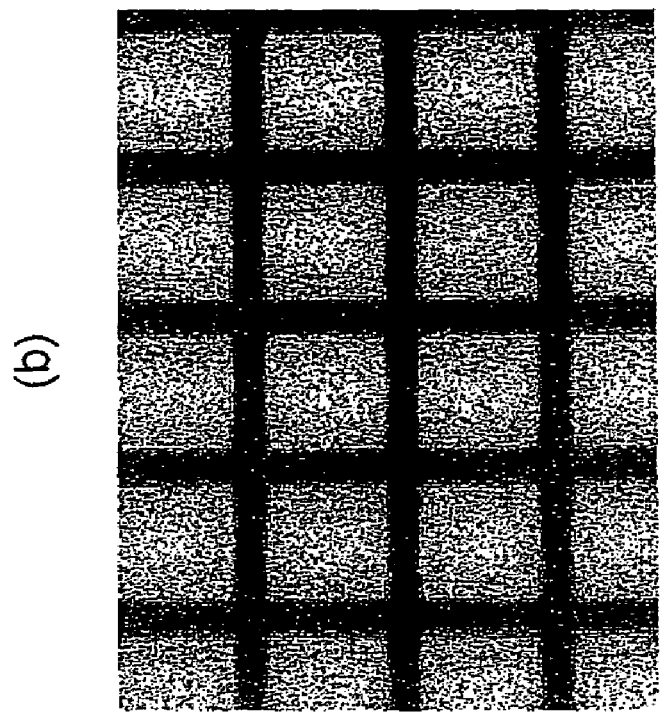
FIG. 5 is a graph showing results of a light-emitting experiment in the examples.
Figure 5:
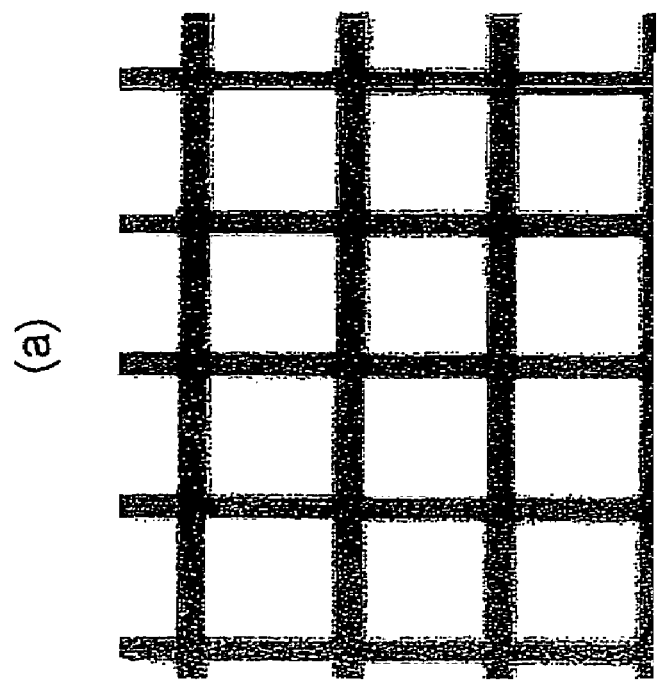

When the inventors actually caused the EL panels #1 and #2 to emit light, as shown in FIG. 5, outlines of the EL devices were clear in the EL panel #1 (see part (a) of FIG. 5), but blurred in the EL panel #2 because of shrinkage occurring therein (see part (b) of FIG. 5).

The foregoing difference between the EL panels #1 and #2 seems to have occurred because resin components of the sealing resin eroded the organic layer in the EL panel #2, whereas the erosion was suppressed by the space in the EL panel #1.

What is claimed is:

1. An EL panel comprising:
   a plurality of EL devices constructed by successively laminating a first electrode, an organic layer, and a second electrode on a substrate;
   a wall positioned between the EL devices adjacent to each other; and
   a sealing plate integrally covering the plurality of EL devices and the wall;
   wherein a resin is interposed between the EL devices and the sealing plate on the substrate,
   the wall and the resin are in contact with each other, and
   a space is formed between the wall and the organic layer of the EL devices, a wall side end face of the organic layer being exposed to the space and not in contact with the resin.

2. An EL panel according to claim 1, wherein the space is a vacuum or filled with an inert gas.

3. A method of making an EL panel, the method comprising:
   forming a wall on a substrate formed with a first electrode;
   successively laminating an organic layer and a second electrode on the substrate so as to form a plurality of EL devices including the first electrode, organic layer, and second electrode; and
   bonding a sealing plate coated with a resin and the substrate to each other such that the resin side of the sealing plate and the EL device side of the substrate oppose each other so as to form a space between the wall and the organic layer of the EL devices such that the wall and the resin are in contact with each other and a wall side end face of the organic layer is exposed to the space and not in contact with the resin.

4. A method of making an EL panel according to claim 3, wherein the plurality of EL devices and the wall are covered with the sealing plate coated with the resin in an uncured state.

* * * * *